(12) United States Patent
Nakata

(10) Patent No.: US 9,285,407 B2
(45) Date of Patent: Mar. 15, 2016

(54) SEMICONDUCTOR DEVICE AND SYSTEM

(71) Applicant: Kabushiki Kaisha Toshiba, Minato-ku (JP)

(72) Inventor: Daisuke Nakata, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/284,531

(22) Filed: May 22, 2014

(65) Prior Publication Data

US 2015/0204926 A1  Jul. 23, 2015

Related U.S. Application Data

(60) Provisional application No. 61/930,333, filed on Jan. 22, 2014.

(51) Int. Cl.
*G01R 27/26* (2006.01)
*G01R 31/26* (2014.01)

(52) U.S. Cl.
CPC ............ *G01R 27/2605* (2013.01); *G01R 31/26* (2013.01)

(58) Field of Classification Search
CPC ............................ G01R 27/2605; G01R 31/26
See application file for complete search history.

(56) References Cited

U.S. PATENT DOCUMENTS

2007/0170931 A1\* 7/2007 Snyder .......................... 324/658
2011/0186978 A1\* 8/2011 Kim et al. ..................... 257/686

FOREIGN PATENT DOCUMENTS

| JP | 6-331668 | 12/1994 |
| JP | 2001-27655 | 1/2001 |
| JP | 2009-25043 | 2/2009 |
| JP | 2013-007691 | 1/2013 |

\* cited by examiner

*Primary Examiner* — Whitney T Moore
(74) *Attorney, Agent, or Firm* — Oblon, McClelland, Maier & Neustadt, L.L.P.

(57) ABSTRACT

According to one embodiment, there is provided a semiconductor device including a package, a semiconductor chip, and a capacitor. The semiconductor chip has an electrode. The semiconductor chip is implemented in the package. The capacitor is implemented in the package. One terminal of the capacitor is electrically connected to the electrode of the semiconductor chip. Another terminal of the capacitor is electrically connected to a ground terminal of the package. The semiconductor chip includes a capacitance measurement circuit. The capacitance measurement circuit measures a level of capacitance of the capacitor via the electrode of the semiconductor chip.

6 Claims, 11 Drawing Sheets

FIG.11

| 221a <CONDITION IDENTIFIER> | 221b <DETERMINATION RESULT> | 221c <TIMESTAMP> |
|---|---|---|
| CD1 | OK | tA1 |
| CD2 | OK | tA2 |
| ⋮ | ⋮ | ⋮ |
| CD1 | NG | tB1 |
| CD2 | OK | tB2 |
| ⋮ | ⋮ | ⋮ |
| CD1 | NG | tC1 |
| CD2 | NG | tC2 |
| ⋮ | ⋮ | ⋮ |

SEMICONDUCTOR DEVICE AND SYSTEM

CROSS-REFERENCE TO RELATED APPLICATIONS

This application is based upon and claims the benefit of priority from Provisional Application No. 61/930,333, filed on Jan. 22, 2014; the entire contents of which are incorporated herein by reference.

FIELD

Embodiments described herein relate generally to a semiconductor device and a system.

BACKGROUND

A capacitor implemented on a package often causes a short between electrodes, an open between electrodes, and variation of capacitance, due to dispersion of production or assembly. However, a tester apparatus mere detects the short between electrodes when conducting a product shipment inspection of the capacitor implemented on the package.

BRIEF DESCRIPTION OF THE DRAWINGS

FIG. 11 is a schematic diagram of a data structure of history information stored in the register in the semiconductor device according to the third embodiment.

DETAILED DESCRIPTION

In general, according to one embodiment, there is provided a semiconductor device including a package, a semiconductor chip, and a capacitor. The semiconductor chip has an electrode. The semiconductor chip is implemented in the package. The capacitor is implemented in the package. One terminal of the capacitor is electrically connected to the electrode of the semiconductor chip. Another terminal of the capacitor is electrically connected to a ground terminal of the package. The semiconductor chip includes a capacitance measurement circuit. The capacitance measurement circuit measures a level of capacitance of the capacitor via the electrode of the semiconductor chip.

Exemplary embodiments of a semiconductor device will be explained below in detail with reference to the accompanying drawings. The present invention is not limited to the following embodiments.

First Embodiment

Figure 1:
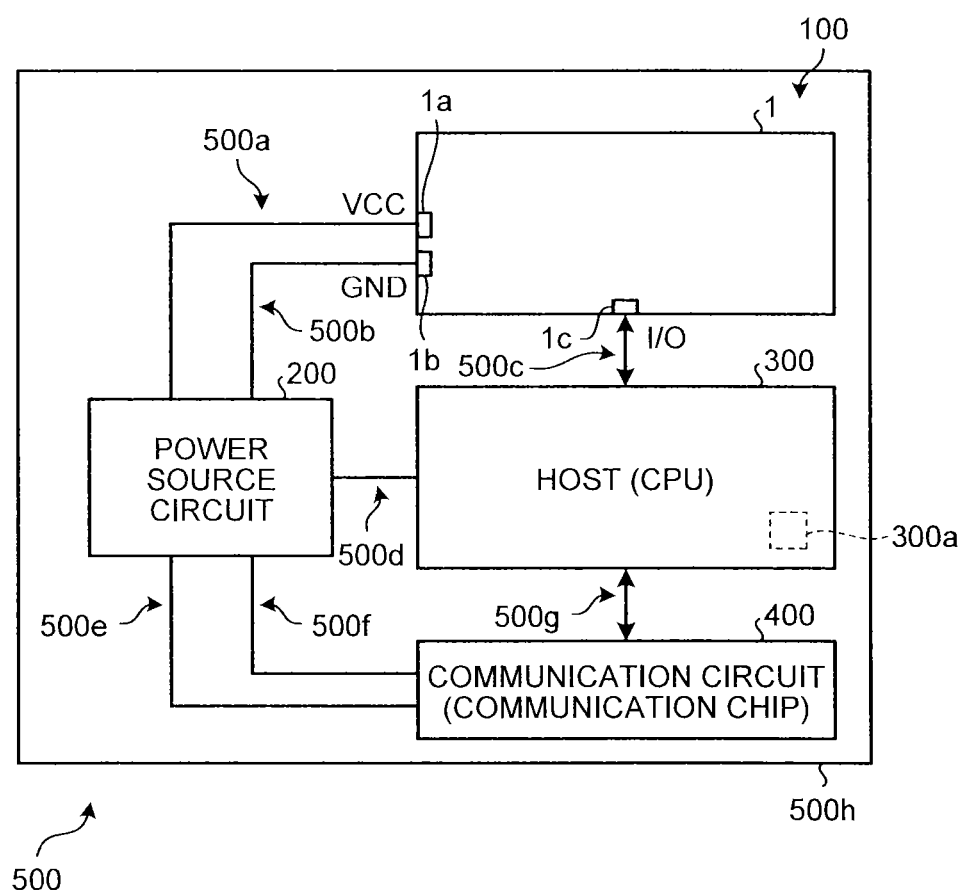
FIG. 1 is a schematic diagram of a configuration of a system including a semiconductor device according to a first embodiment.

A first embodiment according to a semiconductor device 100 is described below. The semiconductor device 100 may be implemented in a form of a package 1, for example. FIG. 1 is a schematic diagram of a configuration of a system 500 including the semiconductor device 100. The semiconductor device 100 includes a memory, controller thereof and the like, for example.

The system 500 includes the semiconductor device 100, a power source circuit 200, a host 300 and a communication circuit 400. The semiconductor device 100, the power source circuit 200, the host 300 and the communication circuit 400 are implemented on a mother board 500h and connected each other through lines 500a-500g.

The host 300 may be, for example, a CPU (Central Processing Unit) to control the system 500 entirely.

For example, when the system 500 has, as operation modes, a fast operation mode and a slow operation mode, the host 300 switches the operation modes of system 500 between the fast operation mode and the slow operation mode. Alternatively, for example, when the system 500 has, as operation modes, a fast operation mode, a medium operation mode and a slow operation mode, the host 300 switches the operation modes of system 500 among the fast operation mode, the medium operation mode and the slow operation mode. The fast operation mode is defined as an operation mode in which throughput of the processing has higher priority than reliability of the processing. The slow operation mode is defined as an operation mode in which reliability of the processing has higher priority than throughput of the processing. The slow operation mode is also referred to as a high reliability mode. The medium operation mode is defined as an intermediate operation mode between the fast operation mode and the slow operation mode.

The host 300 accesses the semiconductor device 100 via line 500c and controls the communication circuit 400 via line 500g. In the fast operation mode, the host 300 accesses the semiconductor device 100 at high speed and causes the communication circuit 400 to communicate at high speed. In the slow operation mode, the host 300 accesses the semiconductor device 100 at slower speed than the fast operation mode and causes the communication circuit 400 to communicate at slower speed than the fast operation mode. If the system 500 has the medium operation mode, in the medium operation mode, the host 300 accesses the semiconductor device 100 at middle speed between the fast operation mode and the slow operation mode and causes the communication circuit 400 to communicate at middle speed between the fast operation mode and the slow operation mode.

For example, the host 300 activates the power source circuit 200 upon recognizing a startup of the system 500. The power source circuit 200 supplies a power source voltage (e.g., VCC) to the semiconductor device 100 and the communication circuit 400 via power lines 500a, 500e, respectively. The power source circuit 200 supplies a ground voltage (e.g., VSS) to the semiconductor device 100 and the communication circuit 400 via ground lines 500b, 500f, respectively.

Figure 2:
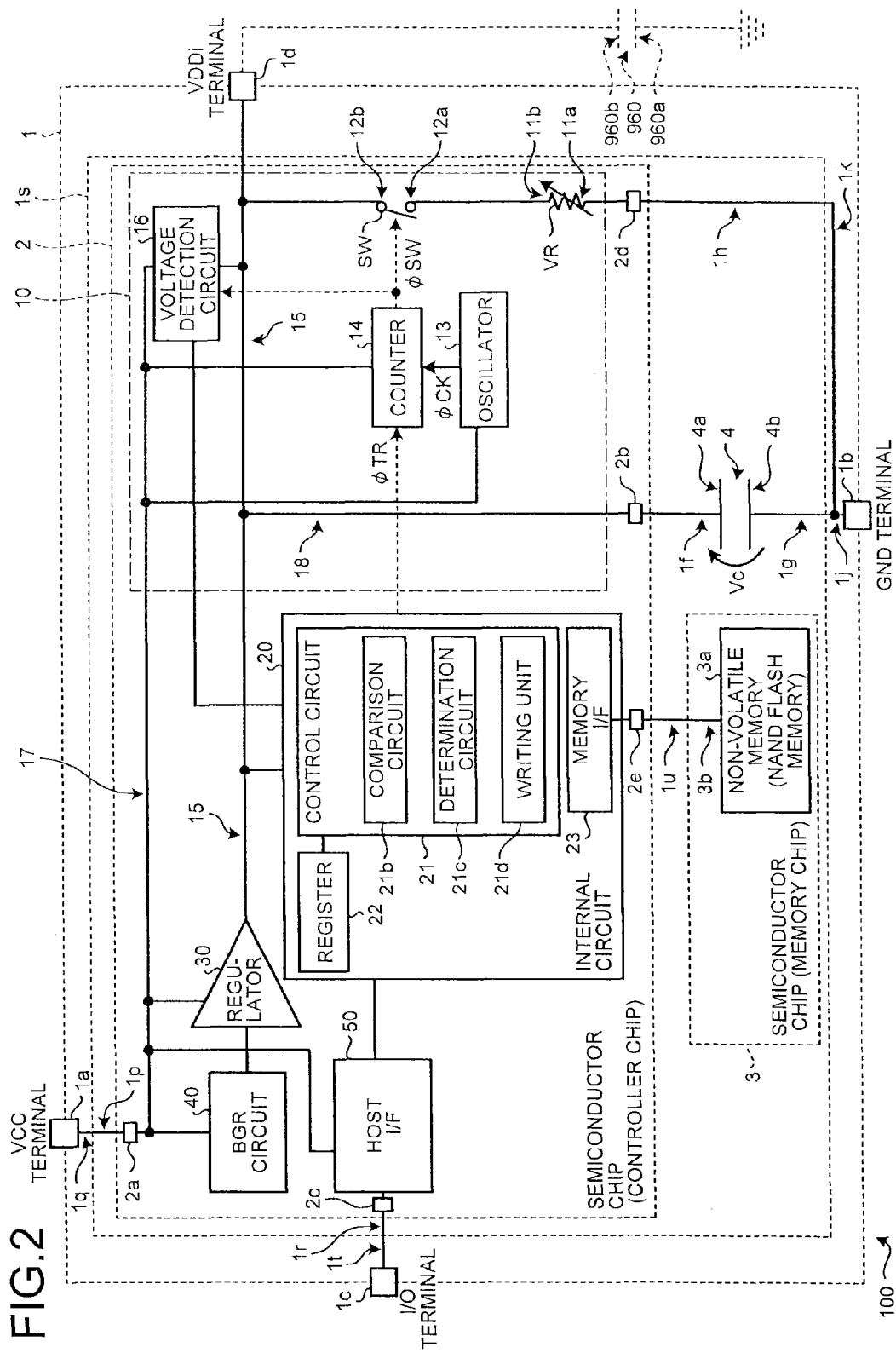
FIG. 2 is a schematic diagram of the configuration of the semiconductor device according to the first embodiment.

Upon these operations, the package 1 receives the VCC voltage via a VCC terminal 1a. The package 1 receives the ground voltage via a ground terminal 1b. For example, in the package 1 as depicted in FIG. 2, a regulator 30 adjusts a voltage level of the power source into an internal power source voltage level of the package 1 to supply the internal power source voltage level to a power line 15. An internal circuit 20 performs by receiving the internal power source voltage level via the power line 15. FIG. 2 is a schematic diagram of a configuration of the semiconductor device 100.

In this configuration, a potential of the power line 15 can transitionally fluctuate by an influence due to a difference in potential between the power source voltage level (e.g., 1.3V) and the internal power source voltage level (e.g., 1.1V). In addition, a potential of the power line 15 can also transitionally fluctuate due to an overshoot of the potential of the power line 15 when rising from an initial level (e.g., 0V) to the internal power source voltage level (e.g., 1.1V). Since excessive potential fluctuation of the power line 15 can cause malfunction of the internal circuit 20, it is preferable to suppress the potential fluctuation of the power line 15.

Consider a case where a capacitor 960 is externally connected to the power line 15 through the VDDi terminal 1d in order to suppress the potential fluctuation of the power line 15, as indicated by broken line in FIG. 2. One end 960a of the capacitor 960 is connected to a ground potential while the other end 960b of the capacitor 960 is connected to VDDi terminal 1d. In this case, since an interconnection length from the power line 15 to the capacitor 960 may easily increase and L component of the interconnection may easily increase, noise mixed on the power line 15 can be increased. In addition, capacitance level of capacitor 960 externally connected to the VDDi terminal 1d can be limited by a standard. This makes it difficult for the capacitor 960 to suppress the potential fluctuation of the power line 15 within a requested allowable range.

Therefore, in the embodiment, the package 1 mounts a capacitor 4 instead of externally connecting the capacitor 960. It is inclined to believe that this allows to decrease the interconnection length from the power line 15 to the capacitor 960 and the L component of the interconnection, and thereby allows to secure a capacitance level of the capacitor 4 enough to suppress the potential fluctuation of the power line 15 within the requested allowable range.

In the meantime, there is a possibility that the capacitor 4 implemented on the package 1 causes a short or an open between electrodes and variation of capacitance due to dispersion of production or assembly. For example, a capacitance level of the capacitor 4 may be shifted from that of a design specification depending on production process. For example, even if a capacitance level of the capacitor 4 complies with a design specification by itself, a capacitance level of the capacitor 4 can be shifted from that of a design specification depending on the assembled state when implementing the capacitor 4 on a substrate 1s of the package 1. If a short or an open between electrodes and variation of capacitance occurs in the capacitor 4, it may be impossible to allow the capacitor 4 to have a capacitance level sufficient to suppress the potential fluctuation of the power line 15 within a range of tolerance. Therefore, it is necessary to test the capacitor 4 implemented on the package 1 prior to shipping the product of the semiconductor device 100.

However, the tester apparatus for testing the semiconductor device 100 can merely provide a test of applying a direct current to the capacitor 4 because it is assumed that the semiconductor device 100 performs by the direct current. That is, the tester apparatus for testing the semiconductor device 100 can merely detect a short between electrodes of the capacitor 4. If a special tester (e.g., impedance analyzer) capable of detecting open between electrodes or variation of capacitance is provided, it leads to increasing of a cost and a time period for testing the capacitor 4, thereby increasing production costs of semiconductor device 100. It is, therefore, desirable to provide a technique for detecting the open between electrodes or variation of capacitance without using such special testers.

Therefore, in the embodiment, a capacitance measurement circuit 10 is provided within a semiconductor chip 2 in order to conduct a self-check of the open between electrodes or the variation of capacitance.

Specifically, the semiconductor device 100 includes the package 1, the semiconductor chip 2, the semiconductor chip 3 (second semiconductor chip) and the capacitor 4. For example, the semiconductor device 100 may be UFS (Universal Flash Storage), eMMC (Embedded Multi Media Card) or the like. For example, the semiconductor chip 2 may be controller chip. The semiconductor chip 3 may be a memory chip, for example.

The package 1 houses the semiconductor chip 2, the semiconductor chip 3 and the capacitor 4. For example, the package 1 contains a substrate 1s, a VCC terminal 1a, a GND terminal 1b, an I/O terminal 1c, a VDDi terminal 1d and lines 1j, 1k, 1q, 1t. The semiconductor chip 2, the semiconductor chip 3 and the capacitor 4 are implemented on or above the substrate 1s. Substrate lines 1f, 1g, 1h, 1p, 1r, 1u are embedded on or within the substrate 1s. The substrate 1s is composed of a dielectric material (e.g., epoxy resin). Lines 1j, 1k, 1q, 1t may be bonding wires, for example.

It should be noted that the package 1 may be entirely covered with dielectric material (e.g., a mold resin) such that the semiconductor chip 2, the semiconductor chip 3 and the capacitor 4 are electrically isolated with being implemented on the substrate 1s.

The semiconductor chip 3 may be mounted on the package 1 and implemented, for example, on the substrate 1s. The semiconductor chip 3 includes an electrode 3b and non-volatile memory 3a. The electrode 3b is electrically connected to the semiconductor chip 2 through a substrate line 1u as well as being electrically connected to a non-volatile memory 3a within the semiconductor chip 3. The non-volatile memory 3a may be a NAND flash memory, for example.

The capacitor 4 may be mounted on the package 1 and implemented, for example, on the substrate 1s. One terminal 4a of the capacitor 4 is electrically connected to an electrode 2b of the semiconductor chip 2 through the substrate line 1f, while the other terminal 4b of the capacitor 4 is electrically connected to a GND terminal 1b through a substrate line 1g and line 1j.

The semiconductor chip 2 may be mounted on the package 1 and implemented, for example, on the substrate 1s. The semiconductor chip 2 includes electrodes 2a, 2b, 2c, 2d, 2e, a BRG circuit 40, a regulator 30, a host I/F 50, an internal circuit 20 and a capacitance measurement circuit 10.

The electrode 2a is electrically connected to a VCC terminal 1a through a substrate line 1p and line 1q. The electrode 2b is electrically connected to the capacitor 4 through a substrate line 1f. The electrode 2c is electrically connected to the I/O terminal 1c through a substrate line 1r and a line 1t. The electrode 2d is electrically connected to the GND terminal 1b through a substrate line 1h and line 1k, 1j. The electrode 2e is electrically connected to the semiconductor chip 3 through a substrate line 1u.

The BRG (Band Gap Reference) circuit 40 receives a power source voltage at a VCC terminal 1a through an electrode 2a. The BRG circuit 40 compensates for temperature characteristics of the power source voltage. Then, the compensated power source voltage is supplied to a regulator 30.

The regulator 30 receives the power source voltage for operation through power line 17. The regulator 30 receives the compensated power source voltage from the BRG circuit 40. The regulator 30 regulates (e.g., performs level shifting of) the compensated power source voltage level (e.g., 1.3 V) to an internal power source voltage level (e.g., 1.1 V).

The host I/F 50 receives the power source voltage through power line 17. The host I/F 50 transfers, to the internal circuit 20, commands and/or data received at an I/O terminal 1c from the host 300. The host I/F 50 receives data from the internal circuit 20 and transmits the data to the host 300 via an I/O terminal 1c.

The internal circuit 20 receives the internal power source voltage from the regulator 30 through the power line 15. The internal circuit 20 performs using the internal power source voltage. The internal circuit 20 includes a control circuit 21, a register 22, and a memory I/F 23, for example. The control circuit 21 controls a characteristics and operation of a capacitance measurement circuit 10. The control circuit 21 determines whether a capacitance level of the capacitor 4 is OK or NG, and writes a result of determination into a register 22. The register 22 is memory device which dedicates to a control circuit 21. The register 22 may be rewritable memory device such as a RAM, a NAND flash memory or the like. The memory I/F 23 interfaces with the non-volatile memory 3a when the non-volatile memory 3a is to be accessed from the host 300. The memory I/F 23 causes the non-volatile memory 3a to write data in accordance with writing command from the host 300. The memory I/F 23 also causes the non-volatile memory 3a to read data and transfer the data to the host 300 in accordance with reading command from the host 300.

The capacitance measurement circuit 10 measures a capacitance level of the capacitor 4 through an electrode 2b. The capacitance measurement circuit 10 measures the capacitance level of the capacitor 4 in a direct current manner. The capacitance measurement circuit 10 measures the capacitance level of the capacitor 4 by utilizing the characteristics of discharge of the capacitor 4. The capacitance measurement circuit 10 detects a level of voltage Vc of the capacitor 4 while discharging the capacitor 4 through the electrode 2b.

The capacitance measurement circuit 10 includes a variable resistance VR, a switch SW, an oscillator 13, a counter 14 and a voltage detection circuit 16, for example. The variable resistance VR is electrically connected to the capacitor 4 such that a loop circuit including the capacitor 4 and the variable resistance VR is closed when the switch SW turns on, and that the loop circuit including the capacitor 4 and the variable resistance VR is open when the switch SW turns off. For example, one terminal 11a of the variable resistance VR is electrically connected to the other terminal 4b of the capacitor 4 through an electrode 2d, a substrate line 1h, line 1k and a substrate line 1g. One terminal 11a of the variable resistance VR and the other terminal 4b of the capacitor 4 are electrically connected to GND terminal 1b through a line 1j. The other terminal 11b of the variable resistance VR is electrically connected to one terminal 4a of the capacitor 4 through a switch SW, a power line 15, a line 18, an electrode 2b and a substrate line 1f. Resistance value of the variable resistance VR is set to a predetermined value (e.g., default resistance value).

The switch SW receives, at a control terminal, a control signal φSW from a counter 14. The switch SW turns on during a time period in which the control signal φSW is at active level. The switch SW turns off during a time period in which the control signal φSW is at non-active level. This allows the switch SW to make the loop circuit including the capacitor 4 and the variable resistance VR closed when discharging the capacitor 4, and to make the loop circuit including the capacitor 4 and the variable resistance VR open when recharging the capacitor 4.

For example, one terminal 12a of the switch SW is electrically connected to the other terminal 4b of the capacitor 4 through the variable resistance VR, an electrode 2d, a substrate line 1h, line 1k and a substrate line 1g. The other terminal 12b of the switch SW is electrically connected to one terminal 4a the capacitor 4 through the switch SW, the power line 15, the line 18, an electrode 2b, a substrate line 1f. One terminal 12a of the switch SW is electrically connected to the other terminal 11b of variable resistance VR. The other terminal 12b of the switch SW is electrically connected to a power line 15.

The oscillator 13 receives an internal power source voltage for operation through a power line 17. Upon the semiconductor device 100 starting up, the oscillator 13 generates a clock signal φCK with a predetermined frequency (e.g., a default frequency) to supply the clock signal φCK to the counter 14.

The counter 14 receives an internal power source voltage for operation through the power line 17. The counter 14 receives a trigger signal φTR and a clock signal φCK from the control circuit 21 and the oscillator 13, respectively. When the trigger signal φTR is at active level, the counter 14 commences count down accordingly and changes a level of the control signal φSW to active level to provide the control signal φSW to the control terminal of the switch SW. Then, the counter 14 changes, in synchronization with a timing when the counter 14 counts a predetermined number of clocks (e.g., a default number of clocks), a level of the control signal φSW from active level to non-active level to provide the control signal φSW to a control terminal of the switch SW and to the voltage detection circuit 16.

The voltage detection circuit 16 detects a voltage of the power line 15 in synchronization with a timing in which a level of the control signal φSW is changed from active level to non-active level. That is, the voltage detection circuit 16 detects a voltage Vc of the capacitor 4 by detecting the voltage of the power line 15. The voltage detection circuit 16 supplies the detected voltage to the control circuit 21.

In response to this, the control circuit 21 compares the detected voltage with a reference voltage Vf. The control circuit 21 determines whether a capacitance of the capacitor 4 is OK or NG based on a result of comparison. The reference voltage Vf serving as determination criteria is experimentally decided in advance and is set in the control circuit 21. For example, the control circuit 21 determines that the capacitance level of the capacitor 4 is OK when the detected voltage is greater than the reference voltage Vf. The control circuit 21 determines that the capacitance level of the capacitor 4 is NG when the detected voltage is less than the reference voltage Vf. The control circuit 21 writes determination result information including the result of the determination into a register 22.

For example, if C is the capacitance of the capacitor 4, V is a voltage of the power line 15 before discharging, V' is a voltage of the power line 15 after discharging, Ivr is a current flowing through the variable resistance VR and T is a discharging time period, the following relationship is obtained.

$$CV'=CV-Ivr*T \qquad \text{formula 1}$$

As indicated by the formula 1, if each of the values of V, Ivr and T is constant, the less a level of capacitance C becomes, the less a level of voltage V' after discharging becomes. It is, therefore, possible to recognize a level of capacitance C by detecting the level of voltage V' after discharging associated with a voltage drop from the voltage V before discharging to the voltage V' after discharging. For example, when a level of voltage V' after discharging becomes less than the reference voltage Vf, it is possible to determine that a level of capacitance C degrades as compared with the reference value.

The control circuit 21 may include a comparison circuit 21b, a determination circuit 21c and a writing unit 21d, for example. The reference voltage Vf is set within the comparison circuit 21b in advance. The comparison circuit 21b receives a detected voltage from a voltage detection circuit 16. The comparison circuit 21b compares the detected voltage with the reference voltage Vf to output the result of the comparison to a determination circuit 21c. The determination circuit 21c determines that a level of capacitance of the capacitor 4 is OK when receiving the result that the detected voltage is equal to or greater than the reference voltage Vf. The determination circuit 21c determines that a level of capacitance of the capacitor 4 is NG when receiving the result that the detected voltage is less than the reference voltage Vf. The determination circuit 21c submits the result of determination to a writing unit 21d. The writing unit 21d generates determination result information containing a determination result to write it into a register 22. For example, a writing unit 21d may overwrite and update the determination result information in a case where a register 22 already stores the determination result information.

The control circuit 21 reads the determination result information from the register 22 in response to a request from a host 300 or at a predetermined timing (e.g., a timing in which a writing has been conducted), to transmit the determination result information to a host 300 via a host interface 50 and I/O terminal 1c, whereby the host 300 is capable of recognizing whether a voltage Vc of the capacitor C is OK or NG under a predetermined discharge condition (e.g. an default discharge condition). For example, the host 300 may cause the system 500 to operate in the fast mode when a voltage Vc of the capacitor 4 is OK. The host 300 can switch operation mode of the system 500 from the fast mode into a middle mode or a slow mode when a voltage Vc of the capacitor 4 becomes to be NG.

Figure 3:
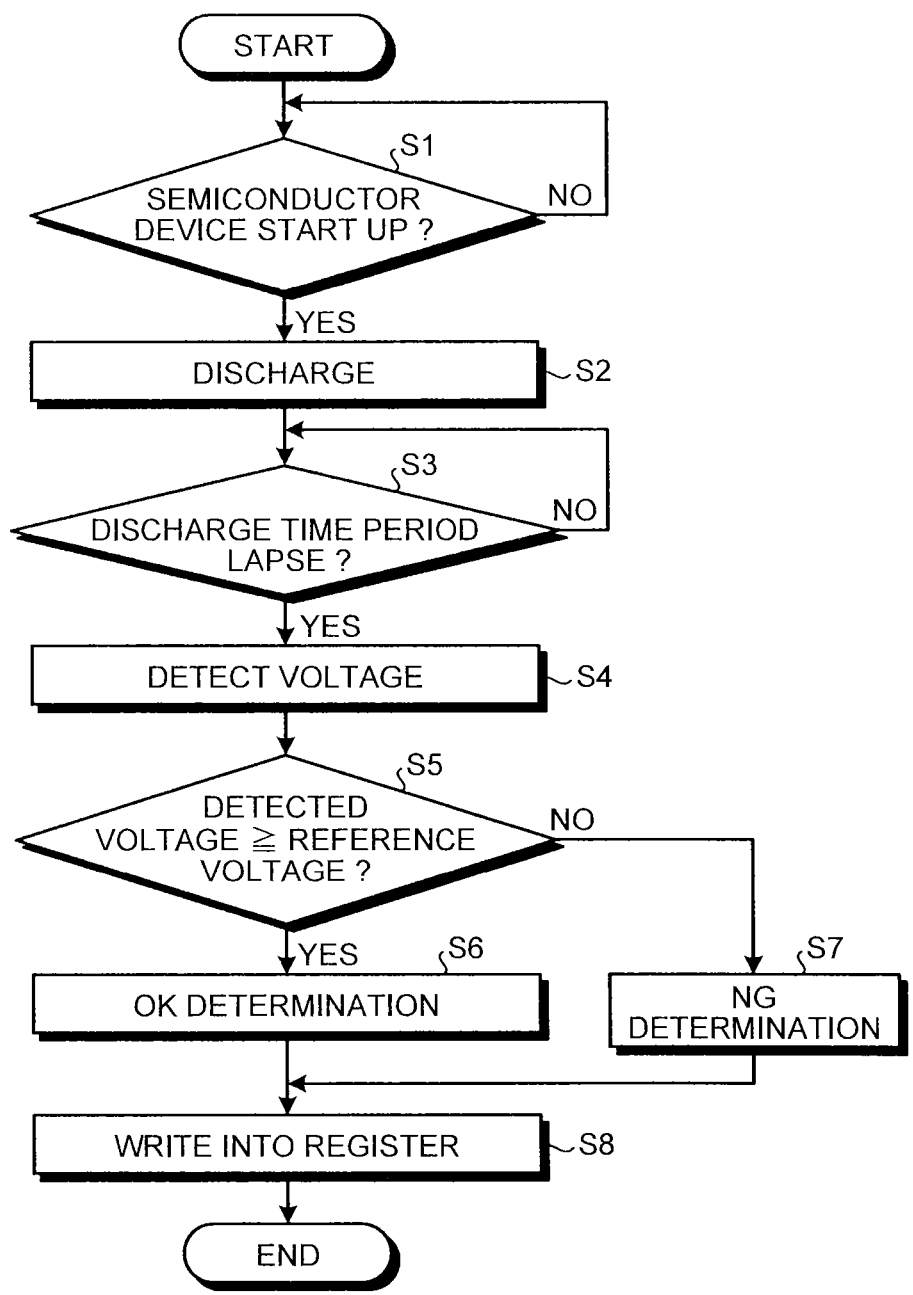
FIG. 3 is a flowchart of an operation of the semiconductor device according to the first embodiment.
Figure 4:
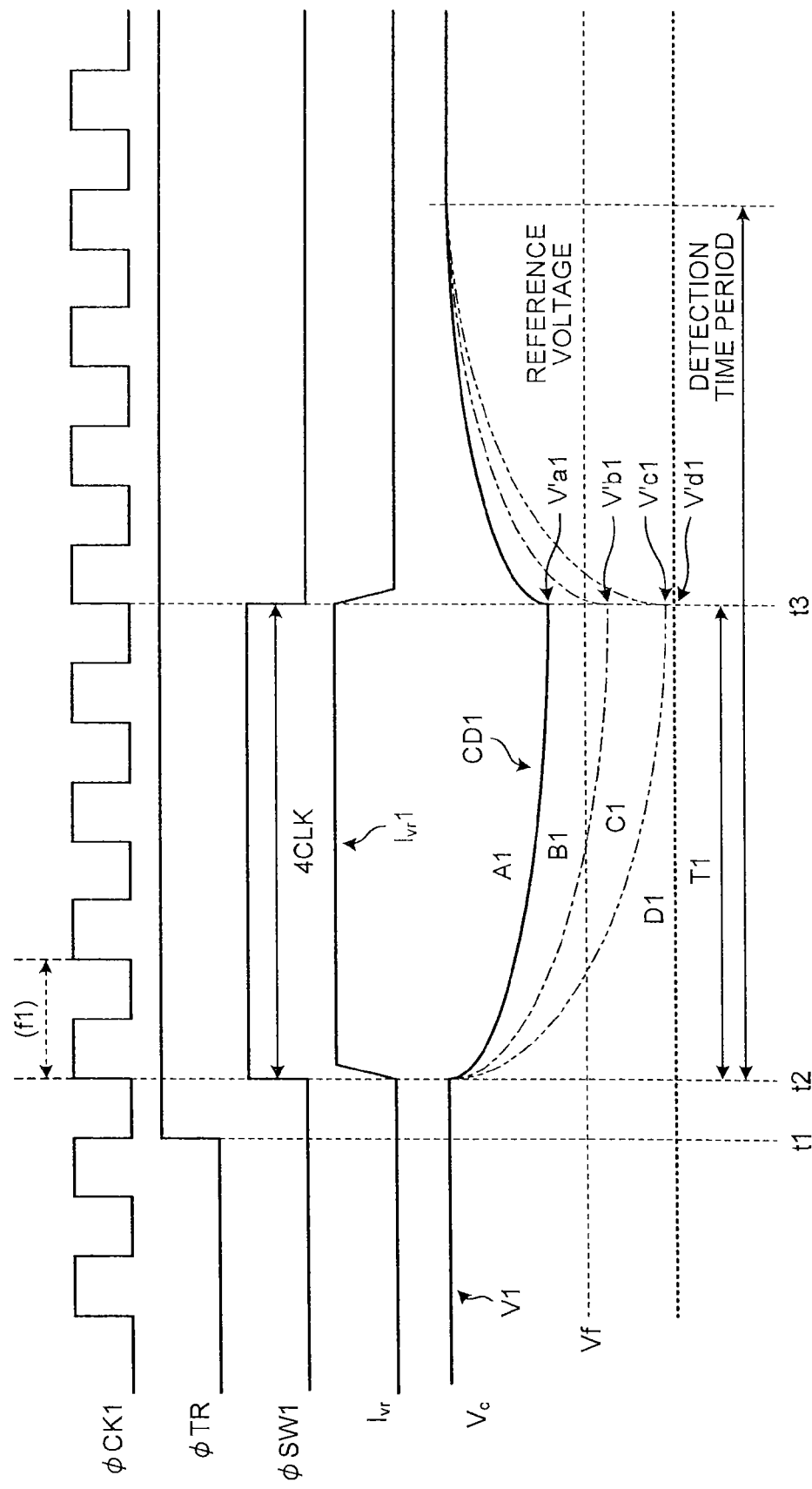
FIG. 4 is a timing chart of an operation of the semiconductor device according to the first embodiment.

Next, performance of the semiconductor device 100 is described with reference to FIGS. 3 and 4. FIG. 3 is a schematic flowchart of the semiconductor device 100. FIG. 4 is a schematic timing chart of the semiconductor device 100.

As shown FIG. 3, in step S1, a control circuit 21 determines whether the semiconductor device 100 starts up. For example, the control circuit 21 may determines starting up the semiconductor device 100 in response to an internal power voltage via a power line 15. The control circuit 21 returns the process to step S1 when the semiconductor device 100 does not start up ("No" in step S1). In this case, as shown in FIG. 4, a switch SW turns off, whereby a current Ivr does not flow through a variable resistance VR, and a voltage Vc of the capacitor 4 is equivalent to the internal power source voltage V1 (e.g., 1.1 V).

The control circuit 21 proceeds the process into step S2 when the semiconductor device 100 starts up ("Yes" in step S1).

In step S2 as shown in FIG. 3, the control circuit 21 causes the capacitor 4 to discharge the charges stored in the capacitor 4 in accordance with a predetermined discharging condition (e.g., a default discharging condition CD1).

Specifically, the oscillator 13 receives an internal power voltage through a power line 17 in response to starting up of the semiconductor device 100 to initiate oscillation. The oscillator 13 generates a clock signal φCK having a predetermined frequency (e.g., a default frequency) to supply the clock signal φCK to the counter 14. Furthermore, the counter 14 receives the internal power voltage through the power line 17. The control circuit 21 initiates supplying a trigger signal φTR to a control terminal of the counter 14. The control circuit 21 causes the counter 14 to initiate counting by making a trigger signal φTR being an active level. When the counter initiates counting, the counter 14 makes a control signal φSW be an active level and supplies the control signal φSW to a control terminal of the switch SW.

For example, as shown in FIG. 4, the control circuit 21 changes a level of a trigger signal φTR from non-active to active at a timing t1. The counter 14 initiates counting at a timing t2 which is in synchronization with rising of a clock signal φCK subsequent to the timing t1. In parallel with this, the counter 14 changes a level of a control signal φSW from non-active to active to supply the control signal φSW to a control terminal of the switch SW.

In response to that, the switch SW turns on at a timing t2, whereby a current (discharge current) Ivr flows through the variable resistance VR. A discharge current Ivr comes into a constant value Ivr1 with a predetermined delay time and then is stable. Concurrently, the charges stored in the capacitor 4 are drawn to be discharged into a ground potential through the variable resistance VR. A level of a voltage Vc of the capacitor 4 gradually decays from the value V1 of internal power source voltage.

In step S3 as shown in FIG. 3, the capacitance measurement circuit 10 determines whether a predetermined time period has been lapsed.

Schematically, the counter 14 stops counting at timing of which the predetermined number of clocks (e.g., the default number of clocks) has been counted. In parallel with this, the counter 14 changes a level of a control signal φSW from non-active level to active level to supply the control signal φSW to a control terminal of the switch SW and a voltage detection circuit 16.

For example, as shown in FIG. 4, the counter 14 stops counting at a timing of which four of clocks (i.e., the number of clocks during a discharging time period according to discharge condition) has been counted. In parallel with this, the counter 14 changes a level of a control signal φSW from active level to non-active level to supply the control signal φSW to a control terminal of the switch SW and a voltage detection circuit 16.

In response to that, the switch SW turns off at a timing t3, whereby a current (discharge current) Ivr does not flow through the variable resistance VR. Thus, discharging of stored charges in the capacitor 4 completes.

In step S4 as shown in FIG. 3, the capacitance measurement circuit 10 detects a voltage Vc of the capacitor 4. Specifically, the voltage detection circuit 16 detects a voltage V' of the power line 15 at a timing which is in synchronization with a timing of which the counter has stopped counting. The voltage detection circuit 16 submits the detected voltage V' to a control circuit 21.

For example, as shown in FIG. 4, a voltage detection circuit 16 detects a voltage of the power line 15 at a timing t3. For example, in a case of A1 (e.g., a case of capacitance Ca), the voltage detection circuit 16 detects a voltage V'a1. In a case of B1 (e.g., a case of capacitance Cb<Ca), the voltage detection circuit 16 detects a voltage V'b1 (<V'a1). In a case of C1 (e.g., a case of capacitance Cc<Cb), the voltage detection circuit 16 detects a voltage V'c1 (<V'b1). In a case of D1 (e.g., a case of open between electrodes), the voltage detection circuit 16 detects a voltage V'd1 (<V'c1).

In step S5 as shown in FIG. 3, the control circuit 21 determines whether the voltage V' detected is greater than the reference voltage Vf.

For example, in the case of A1 as shown in FIG. 4, the control circuit 21 determines that the voltage V'a1 detected is greater than the reference voltage Vf. In the case of B1, the control circuit 21 determines that the voltage V'b1 detected is less than the reference voltage Vf. In the case of C1, the control circuit 21 determines that the voltage V'c1 detected is less than the reference voltage Vf.

The control circuit 21 proceeds the process to step S6 if the voltage V' detected is equal to or greater than the reference voltage Vf ("Yes" in step S5). The control circuit 21 proceeds the process to step S7 if the voltage V' detected is less than the reference voltage Vf ("No" in step S5).

In step S6 as shown in FIG. 3, the control circuit 21 determines that a capacitance level of the capacitor 4 is OK. For example, if V=V1, Ivr=Ivr1, T=T1 are substituted in the formula 1, and V1, IVr1 and T1 are constant values, respectively, in the formula 1, the less the capacitance C becomes, the greater the voltage drop from the voltage V1 before discharge to the voltage V' after discharge becomes, as well as the less the capacitance C becomes the less the level of the voltage V' after discharge becomes. For example, in the case of A1 as shown in FIG. 4, since a voltage V'a1 detected is greater than the reference voltage Vf, the control circuit 21 can determine that a capacitance Ca of the capacitor 4 does not degrade for the reference value, that is, OK with respect to the condition CD1. The control circuit 21 generates determination result information containing the determination result that a capacitance Ca of the capacitor 4 is OK.

In step S7, the control circuit 21 determines that a capacitance of the capacitor 4 is NG. For example, if V=V1, Ivr=Ivr1, T=T1 are substituted in the formula 1, and V1, IVr1 and T1 are constant values, respectively, in the formula 1, the less the capacitance C becomes, the greater the voltage drop from the voltage V1 before discharge to the voltage V' after discharge becomes, as well as the less the capacitance C becomes the less the level of the voltage V' after discharge becomes. For example, in the case of B1 as shown in FIG. 4, since a voltage V'b1 detected is less than the reference voltage Vf, the control circuit 21 can determine that a capacitance Cb of the capacitor 4 degrades for the reference value, that is, NG with respect to the discharging condition CD1. In the case of C1 as shown in FIG. 4, since a voltage V'c1 detected is less than the reference voltage Vf, the control circuit 21 can determine that a capacitance Cc of the capacitor 4 degrades for the reference value, that is, NG with respect to the discharging condition CD1. The control circuit 21 generates determination result information containing the determination result that a capacitance Cc of the capacitor 4 is NG. In the case of D1 as shown in FIG. 4, as a voltage V'd1 detected is less than the reference voltage Vf, the control circuit 21 can determine that a capacitance Cd of the capacitor 4 degrades for the reference value (e.g., open between electrodes), that is, NG with respect to the discharging condition CD1.

In step S8, the control circuit 21 writes the determination result information into a register 22. For example, a control circuit 21 may overwrite and update the determination result information in a case where a register 22 already stores the determination result information. The control circuit 21 reads the determination result information from the register 22 in response to a request from a host 300 or at a predetermined timing (e.g., a timing of which a writing has been conducted), to transmit the determination result information to a host 300 via a host interface 50 and I/O terminal 1c.

As described above, in the first embodiment, the semiconductor device 100 includes the capacitance measurement circuit 10 inside the semiconductor chip 2. The capacitance measurement circuit 10 detects, via the electrode 2b of the semiconductor chip 2, a value of capacitance of the capacitor 4 mounted on the package 1. Since this allows the semiconductor device 100 to perform a self-check of a level of capacitance of the capacitor 4, it is possible to easily and precisely test characteristics of a capacitor concerning an open between electrodes and variation of capacitance levels that is difficult to be detected by the tester for the semiconductor device 100, without using a special testing device (e.g., an impedance analyzer).

In the first embodiment, in the semiconductor device 100, the capacitance measurement circuit 10 detects a capacitance level of the capacitor 4 in a direct current manner. For example, the capacitance measurement circuit 10 detects a capacitance level of the capacitor 4 by means of a characteristic of discharge of the capacitor 4, thereby allowing for an easy test of an open between electrodes and a variation of capacitance levels of the capacitor 4.

In the first embodiment, in the semiconductor device 100, the capacitance measurement circuit 10 detects a level of voltage (a potential V' of the power line) of the capacitor 4 while causing the capacitor 4 to discharge charges stored in the capacitor 4 via the electrode 2b of the semiconductor chip 2. The control circuit 21 determines whether a level of capacitance of the capacitor 4 is OK or NG by comparing the detected voltage V' with the reference voltage Vf. This allows to precisely perform tests of open between electrodes and a variation of capacitance levels of the capacitor 4.

In the first embodiment, in the semiconductor device 100, the control circuit 21 determines that the level of capacitance of the capacitor 4 is OK when the detected voltage V' is equal to or greater than the reference voltage Vf, and that the level of capacitance of the capacitor 4 is NG when the detected voltage V' is less than the reference voltage Vf. This allows to determine whether the level of capacitance of the capacitor 4 is OK or NG by comparing the detected voltage V' with the reference voltage Vf.

In the first embodiment, in the semiconductor device 100, the control circuit 21 controls the capacitor measurement circuit 10 so as to measure the value of capacitance of the capacitor 4 in response to starting up of the semiconductor chip 2. This allows to determine a level of capacitance of the capacitor 4 is NG immediately (e.g., during a time period that the internal circuit 20 conducts an initial operation), when the capacitance of the capacitor 4 deteriorates with time.

In the first embodiment, in the semiconductor device 100, the resister 22 stores determination result information including determination result by means of the control circuit 21. This allows the control circuit 21 to read the determination result information from the register 22 to transmit the determination result information to the host 300 through the host interface 50.

In the first embodiment, in the capacitance measurement circuit 10, the switch SW makes the loop circuit including the capacitor 4 and the variable resistance VR closed when discharging the capacitor 4, and makes the loop circuit including the capacitor 4 and the variable resistance VR open when recharging the capacitor 4. This allows the capacitance measurement circuit 10 to measure a level of capacitance of the capacitor 4 based on discharging characteristics of the capacitor 4.

In the first embodiment, in the capacitance measurement circuit 10, the counter 14 counts the number of clocks output from the oscillator and causes the switch SW to turn on or off in accordance with a result of counting. For example, the counter 14 causes the switch SW to turn off at a timing when the counter 14 counts the number of clocks to be counted (i.e., the number of clocks corresponding to a discharge time period under a predetermined condition). This allows the capacitance measurement circuit 10 to measure a value of capacitance of the capacitor 4 under a predetermined discharge condition.

In the first embodiment, in the capacitance measurement circuit 10, the voltage detection circuit 16 detects a potential of the power line 15 which electrically connects an electrode 2b of the semiconductor chip 2 with the other terminal 12b of the switch SW. The voltage detection circuit 16 can detect a voltage of the capacitor 4 by detecting the potential of the power line 15. This allows the capacitance measurement circuit 10 to detect the level of voltage of the capacitor 4 (potential V' of the power line) while causing the capacitor 4 to discharge charges stored in the capacitor 4 via the electrode 2b of the semiconductor chip 2.

In the first embodiment, in the capacitance measurement circuit 10, the voltage detection circuit 16 detects a potential of the power line 15 at a timing that discharge time period has been lapsed. The control circuit 21 determines whether the level of capacitance of the capacitor is OK or NG by comparing the detected voltage V' with the reference voltage Vf. This allows for tests of open between electrodes and a variation of capacitance levels of the capacitor 4 with using a discharge time period under the predetermined discharge condition.

It should be noted that the voltage detection circuit 16 may further detect a potential of the power line 15 prior to discharging charges stored in the capacitor 4. For example, in the case of D1 (open between electrodes) as shown in FIG. 4, there is a possibility that a potential of the power line 15 has already lowered than a threshold level V1. On the contrary, in the cases of A1, B1 and C1 (variation of capacitance) as shown in FIG. 4, the potential of the power line 15 is substantially equal to a threshold level V1. Thus, it is possible to distinctively detect open between electrodes and variation of capacitance of the capacitor 4 by adding a sequence of performing, with respect to the voltage before discharge, a detection of voltage of the capacitor 4 and its comparison with the reference voltage.

Second Embodiment

Now a semiconductor device 100j according to a second embodiment is described in detail. Portions different from the first embodiments are mainly described.

Although the first embodiment exemplifies a case where discharge of capacitor 4 is performed under one discharge condition (e.g., default discharge condition), in the second embodiment, discharges of capacitor 4 are performed under a plurality of conditions.

Specifically, in an internal circuit 20j of a semiconductor chip 2j in the semiconductor device 100j, the control circuit 21j controls a discharge condition for causing the capacitor 4 to discharge. The control circuit 21j controls at least one of a discharge current and a discharge time period. In other words, the control circuit 21j controls the capacitance measurement circuit 10 so as to measure a capacitance of the capacitor 4 under a plurality of conditions in which at least one of a discharge current and a discharge time period differs from each other.

For example, the control circuit 21j may further include a setting circuit 21aj. The setting circuit 21aj sets characteristics of the capacitance measurement circuit 10 to control at least one of a discharge current and a discharge time period.

For example, the setting circuit 21aj supplies, to a control terminal of a counter 14, a control signal φCN1 which assigns the number of clocks to be counted. With this configuration and operation, since it is possible to change and set number of clocks to be counted by the counter 14, it is possible to change and set the discharge time period of the capacitor 4.

For example, the setting circuit 21aj supplies, to a control terminal of a variable resistance VR, a control signal φVR which assigns a value of resistance. With this configuration and operation, since it is possible to change and set a resistance value of the variable resistance VR, it is possible to change and set the discharge current of the capacitor 4.

For example, the setting circuit 21aj supplies to a control terminal of an oscillator 13 a control signal φOF which assigns a value of oscillation frequency. With this configuration and operation, since it is possible to change and set oscillation frequency of the oscillator 13, it is possible to change and set the discharge time period of the capacitor 4 if the number of clocks to be counted by the counter 4 is constant, for example.

Figure 6:
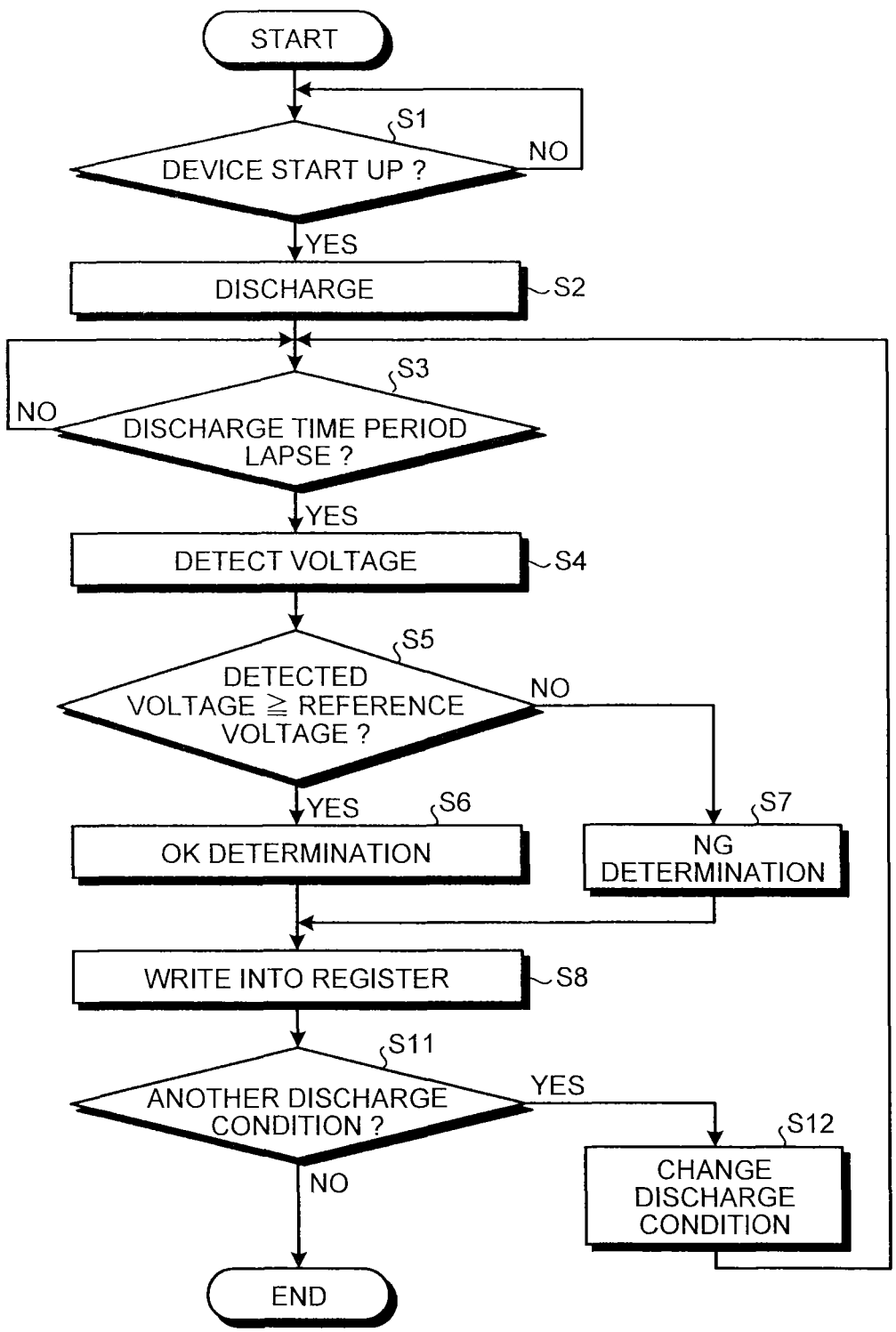
FIG. 6 is a flowchart of an operation of the semiconductor device according to the second embodiment.
Figure 8:
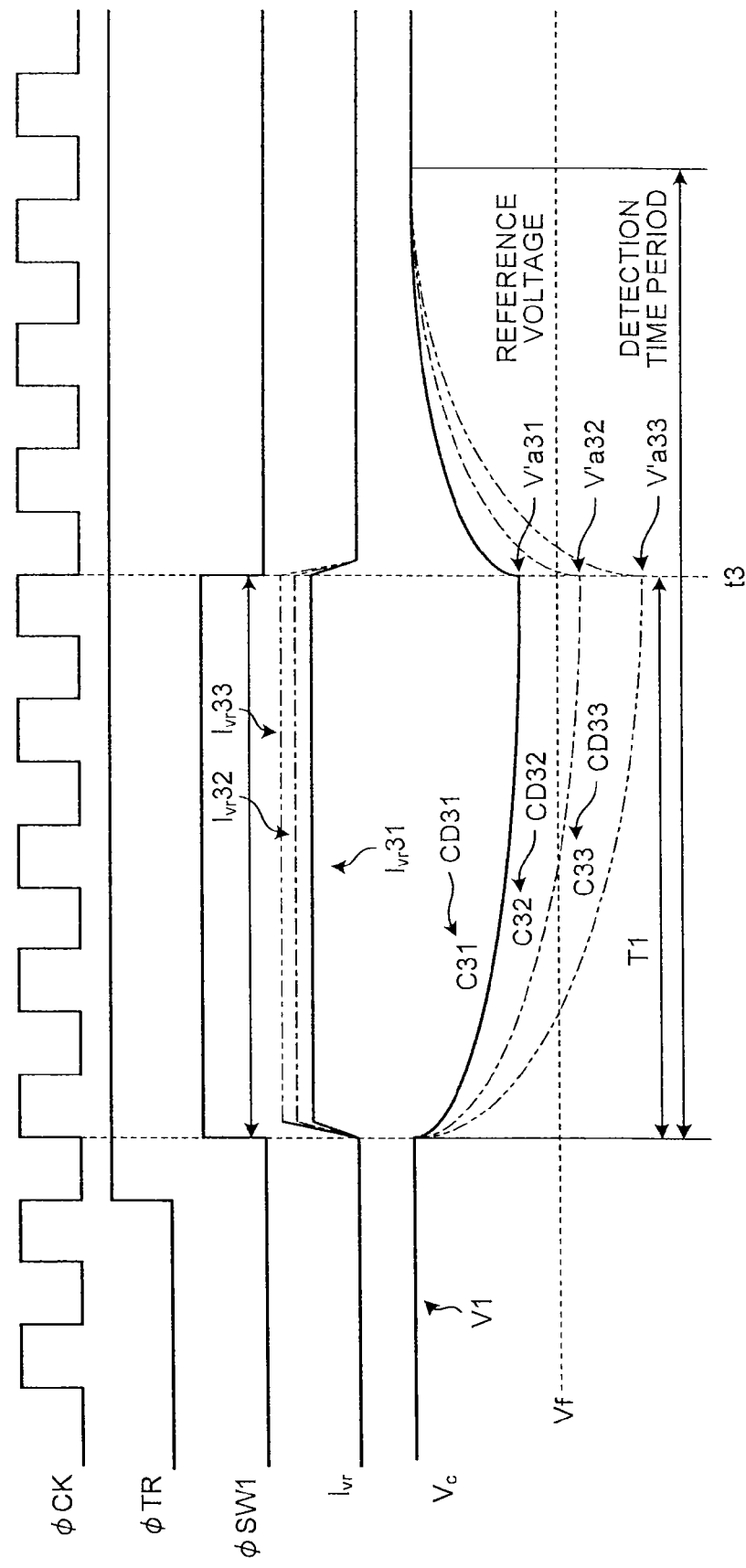
FIG. 8 is a timing chart of an operation of the semiconductor device according to the second embodiment.
Figure 9:
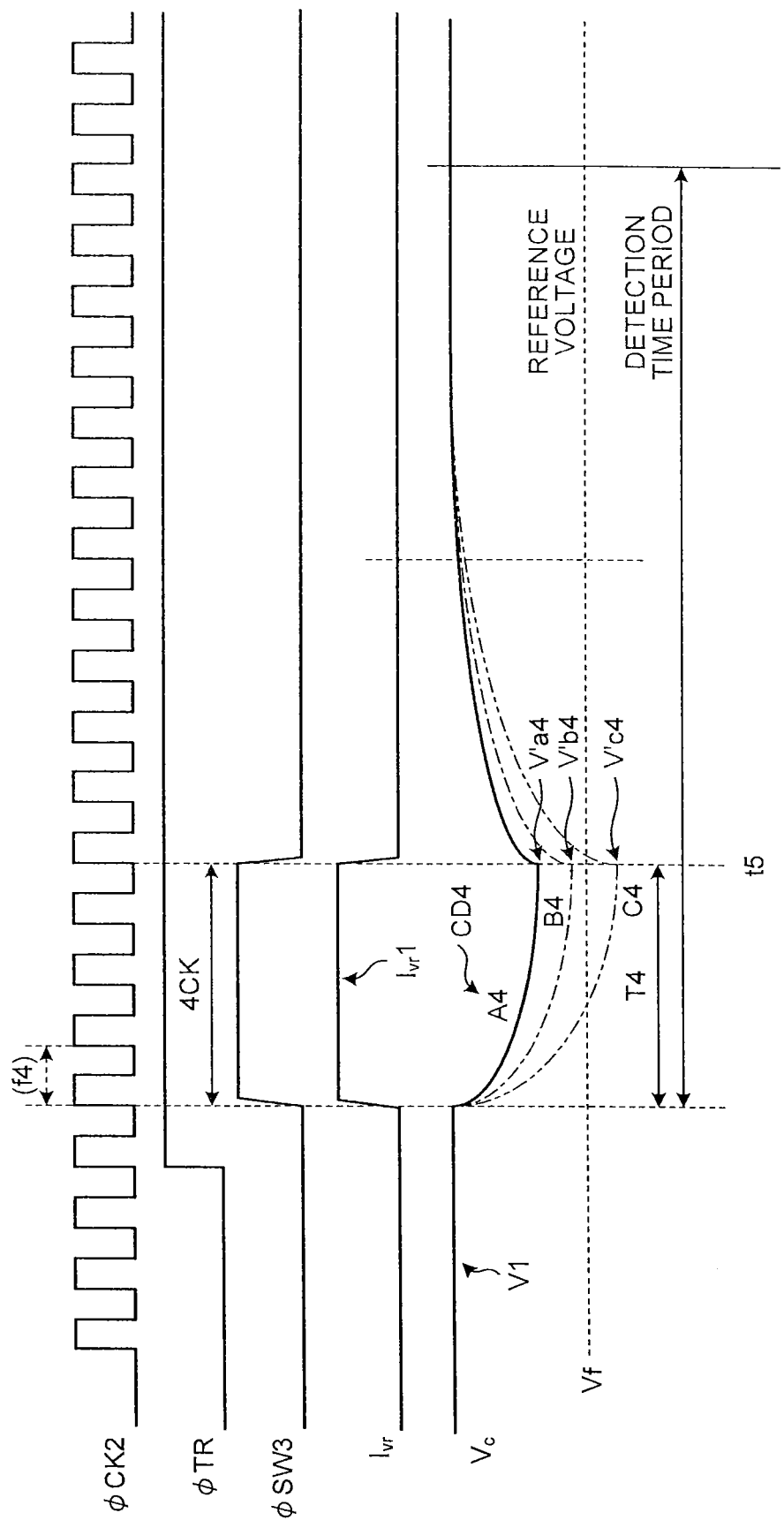
FIG. 9 is a timing chart of an operation of the semiconductor device according to the second embodiment.

The operation of the semiconductor device 100j according to a second embodiment is different from that of the semiconductor device 100 in the following points. FIG. 6 is a flowchart of one example of an operation of a semiconductor device according to a second embodiment. Each of FIGS. 7 to 9 is a timing chart of one example of an operation of a semiconductor device according to a second embodiment.

In step S11 as shown FIG. 6, a control circuit 21j determines whether a capacitor 4 needs to be subject to other condition of discharge. The control circuit 21j may proceed the process to step S12 when determining that a capacitor 4 needs to be subject to other condition of discharge ("Yes" in step S11). The control circuit 21j may finish the process when determining that a capacitor 4 does not need to be subject to other condition of discharge ("No" in step S11).

In step S12, the control circuit 21j controls the capacitance measurement circuit 10 so as to select a discharge condition being unprocessed from among a plurality of discharge conditions, to allow the capacitance 4 to discharge under the selected discharge condition.

Figure 7:
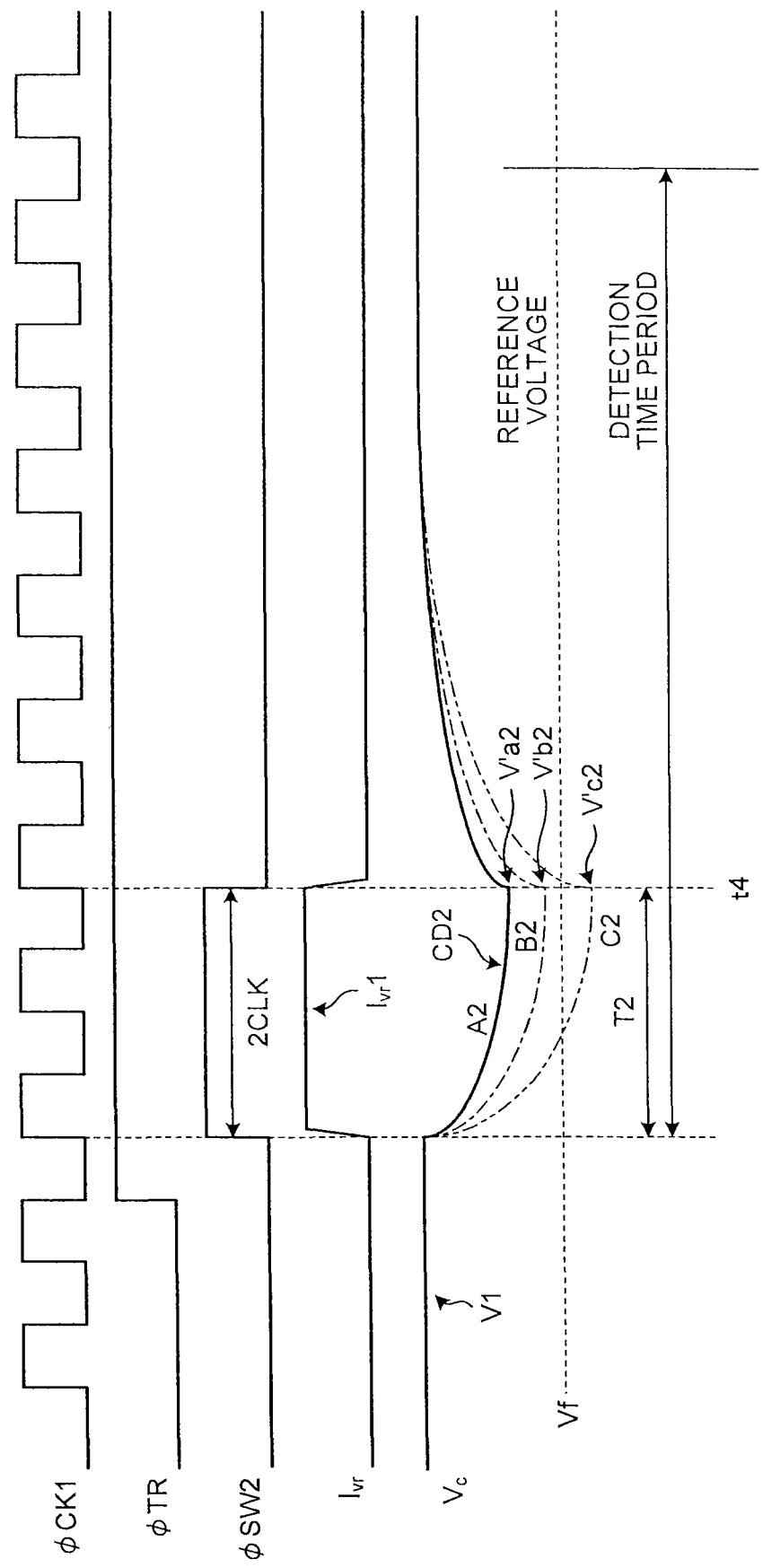
FIG. 7 is a timing chart of an operation of the semiconductor device according to the second embodiment.

For example, as shown in FIG. 7, the control circuit 21j supplies to a control terminal of the counter 14 a control signal φCN1 indicating two clocks as being the number of clocks to be counted. With this operation, since it is possible to change and set the number of clocks to be counted by the counter 14, it is possible to change the discharge time period of the capacitor 4 into the discharge time period T2 (<T1 as shown in FIG. 4). That is, it is possible to control the counter 14 so as to allow the capacitor 4 to discharge during a time period T2 in accordance with a discharge condition CD2. It should be noted that a discharge current Ivr1 may be substantially equal to a discharge current Ivr1 under a discharge condition CD1 (e.g., a default condition).

Here, for example, at a timing t4, a voltage detection circuit 16 detects a voltage of a power line 15. For example, in a case of A2 (e.g., a case of capacitance Ca), the voltage detection circuit 16 detects a voltage V'a2. In a case of B2 (e.g., a case of capacitance Cb<Ca), the voltage detection circuit 16 detects a voltage V'b2 (<V'a2). In a case of C2 (e.g., a case of capacitance Cc<Cb), the voltage detection circuit 16 detects a voltage V'c2 (<V'b2).

For example, as shown in FIG. 8, the control circuit 21j supplies to a control terminal of a variable resistance VR a control signal φVR which assigns a resistance value R31. With this operation, since it is possible change and set a resistance value of the variable resistance VR into resistance value R3, it is possible to change and set the discharge current of the capacitor 4 into the discharge current Ivr31. That is, it is possible to control the variable resistance VR so as to allow the capacitor 4 to discharge with a discharge current Ivr31 in accordance with a discharge condition CD31. It should be noted that a discharge time period T1 may be substantially equal to a discharge time period T1 under a discharge condition CD1 (e.g., a default condition).

Alternatively, the control circuit 21j supplies, to a control terminal of a variable resistance VR, a control signal φVR which assigns a resistance value R32 (<R31). With this operation, since it is possible to change and set resistance value of the variable resistance VR into resistance value R32 (<R31), it is possible to change the discharge current of the capacitor 4 into the discharge current Ivr32 (<Ivr31). That is, it is possible to control the variable resistance VR so as to allow the capacitor 4 to discharge with a discharge current Ivr32 in accordance with a discharge condition CD32. It should be noted that a discharge time period T1 may be substantially equal to a discharge time period T1 under a discharge condition CD1 (e.g., a default condition).

Alternatively, the control circuit 21j supplies, to a control terminal of a variable resistance VR, a control signal φVR which assigns a resistance value R33 (<R32). With this operation, since it is possible to change and set the variable resistance VR into resistance value R33 (<R32), it is possible to change the discharge current of the capacitor 4 into the discharge current Ivr33 (<Ivr32). That is, it is possible to control the variable resistance VR so as to allow the capacitor 4 to discharge with a discharge current Ivr33 in accordance with a discharge condition CD33. It should be noted that a discharge time period T1 may be substantially equal to a discharge time period T1 under a discharge condition CD1 (e.g., a default condition).

Here, for example, at a timing t3, a voltage detection circuit 16 detects a voltage of a power line 15. For example, in a case of C31 (i.e., a case of discharge condition CD31), the voltage detection circuit 16 detects a voltage V'a31. In a case of C32 (i.e., a case of discharge condition CD32), the voltage detection circuit 16 detects a voltage V'a32 (<V'a31). In a case of C33 (i.e., a case of discharge condition CD33), the voltage detection circuit 16 detects a voltage V'a33 (<V'a32).

In an example as shown in FIG. 9, the setting circuit 21j supplies to a control terminal of an oscillator 13 a control signal φOF which assigns a value of oscillation frequency. With this operation, since it is possible to change and set oscillation frequency of the oscillator 13 to be set into oscillation frequency f4 (>oscillation frequency f1 shown in FIG. 4), it is possible to change and set the discharge time period of the capacitor 4 into the discharge time period T4 (<discharge time period T1 shown in FIG. 4). That is, it is possible to control the oscillator 13 so as to allow the capacitor 4 to discharge with a discharge time period T1 in accordance with a discharge condition CD4. It should be noted that a discharge current Ivr1 may be substantially equal to a discharge current Ivr1 under a discharge condition CD1 (e.g., a default condition).

Here, for example, at a timing t5, a voltage detection circuit 16 detects a voltage of a power line 15. For example, in a case of A4 (e.g., a case of capacitance Ca), the voltage detection circuit 16 detects a voltage V'a4. In a case of B4 (e.g., a case of capacitance Cb<Ca), the voltage detection circuit 16 detects a voltage V'b4 (<V'a4). In a case of C4 (e.g., a case of capacitance Cc<Cb), the voltage detection circuit 16 detects a voltage V'c4 (<V'b4).

It should be note that, in step S6 as shown in FIG. 6, the control circuit 21 can generate determination result information in which determination result as being OK is associated with an identifier of a discharge condition (see FIG. 11). In step S7, the control circuit 21 can generate determination result information in which determination result as being NG is associated with an identifier of a discharge condition (see FIG. 11). Then, in step S8, the control circuit 21 can overwrite and update determination result information for every identifiers.

As described above, in a second embodiment, in the semiconductor device 100j, the control circuit 21j controls the capacitor measurement circuit 10 so as to measure the value of capacitance of the capacitor 4 under a plurality of discharge conditions in which at least one of a discharging current and a discharging time period of the capacitor 4 is different from each other. The control circuit 21j determines whether the value of capacitance of the capacitor 4 is OK or NG under the plurality of discharge conditions. A resister 22 stores a plurality of determination results obtained under the plurality of discharge conditions. With this operation, the 300 receiving the plurality of determination results transmitted from a side of the register 22 can recognize a degree of aged deterioration of the capacitance of the capacitor 4 by comparing the plurality of determination results. Consequently, the host 300 can switch operation modes serially to a fast mode->a middle mode->a slow mode in accordance with an advance of a degree of aged deterioration of the capacitance of the capacitor 4.

For example, it is possible to recognize a degree of aged deterioration of capacitance of the capacitor 4 by comparing a discharge condition CD1 as shown in FIG. 4 with a discharge condition as shown in FIG. 7. If the discharge time period T1 is long according to the discharge condition CD1 (see FIG. 4), the case A1 (the case of capacitance being substantially equal to Ca) is OK, the case B1 (the case of capacitance being substantially equal to Cb<Ca) and the case C1 (the case of capacitance being substantially equal to Cc<Cb) are NG. If the discharge time period T2 is short according to the discharge condition CD2 (see FIG. 7), the case A2 (the case of capacitance being substantially equal to Ca) and the case B2 (the case of capacitance being substantially equal to Cb<Ca) are OK, an case C1 (the case of capacitance being substantially equal to Cc<Cb) is NG.

That is, when capacitance of the capacitor 4 degrades with time serially to Ca->Cb->Cc, it is possible to recognize that a degree of aged deterioration of capacitance of the capacitor 4 is nearly at the level of Ca if both a discharge condition CD1 and a discharge condition CD2 are OK. It is possible to recognize that a degree of aged deterioration of capacitance of the capacitor 4 is nearly at the level of Cb if a discharge condition CD1 is NG and a discharge condition CD2 is OK. It is possible to recognize that a degree of aged deterioration of capacitance of the capacitor 4 is nearly at the level of Cc if both a discharge condition CD1 and a discharge condition CD2 are NG.

It is also possible to recognize a degree of aged deterioration of capacitance of the capacitor 4 by comparing discharge conditions CD31, CD32 and CD33 illustrated in FIG. 8 with each other. When the discharge current Ivr31 is small according to discharge condition CD31, a case C31 (a case of capacitance being substantially equal to Cc) is OK. When the discharge current Ivr32 is middle according to discharge condition CD32, a case C32 (a case of capacitance being substantially equal to Cc) is NG.

When the discharge current Ivr33 is large according to discharge condition CD33, a case C33 (a case of capacitance being substantially equal to Cc) is NG.

That is, when capacitance of the capacitor 4 degrades with time serially under discharge conditions CD33-> CD32->CD31, it is possible to recognize that a degree of aged deterioration of capacitance of the capacitor 4 is nearly at the level of CD33 if both a discharge condition CD32 and a discharge condition CD31 are OK and a discharge condition CD33 is NG. It is possible to recognize that a degree of ages of capacitance of the capacitor 4 is nearly at the level of CD32 if both a discharge condition CD33 and a discharge condition CD32 are NG and a discharge condition CD31 is OK. It is possible to recognize that a degree of aged deterioration of capacitance of the capacitor 4 is nearly at the level of CD31 if all discharge conditions are NG.

It is also possible to recognize a degree of aged deterioration of capacitance of the capacitor 4 by comparing a discharge condition CD1 illustrated in FIG. 4 and a discharge condition CD4 illustrated in FIG. 9. When the discharge time period T1 is long according to discharge condition CD1 (see FIG. 4), the case A1 (the case of capacitance being substantially equal to Ca) is OK, the case B1 (the case of capacitance being substantially equal to Cb<Ca) and the case C1 (the case of capacitance being substantially equal to Cc<Cb) are NG. When the discharge time period T4 is short according to discharge condition CD2 (see FIG. 9), the case A4 (the case of capacitance being substantially equal to Ca) and the case B4 (the case of capacitance being substantially equal to Cb<Ca) are OK, the case C4 (the case of capacitance being substantially equal to Cc<Cb) is NG.

That is, when capacitance of the capacitor 4 degrades with time serially to Ca->Cb->Cc, it is possible to recognize that a degree of aged deterioration of capacitance of the capacitor 4 is nearly at the level of Ca if both a discharge condition CD1 and a discharge condition CD4 are OK. It is possible to recognize that a degree of aged deterioration of capacitance of the capacitor 4 is nearly at the level of Cb if a discharge condition CD1 is NG and a discharge condition CD4 is OK. It is possible to recognize that a degree of aged deterioration of capacitance of the capacitor 4 is nearly at the level of Cc if both a discharge condition CD1 and a discharge condition CD4 are NG.

Third Embodiment

Now a semiconductor device 100j according to a third embodiment is described in detail. Portions different from the second embodiment are mainly described.

Although the second embodiment overwrites and updates determination results of a plurality of discharge conditions on the register 22, the third embodiment leave previous determination results as history without overwriting the previous determination results of the plurality of discharge conditions.

Figure 5:
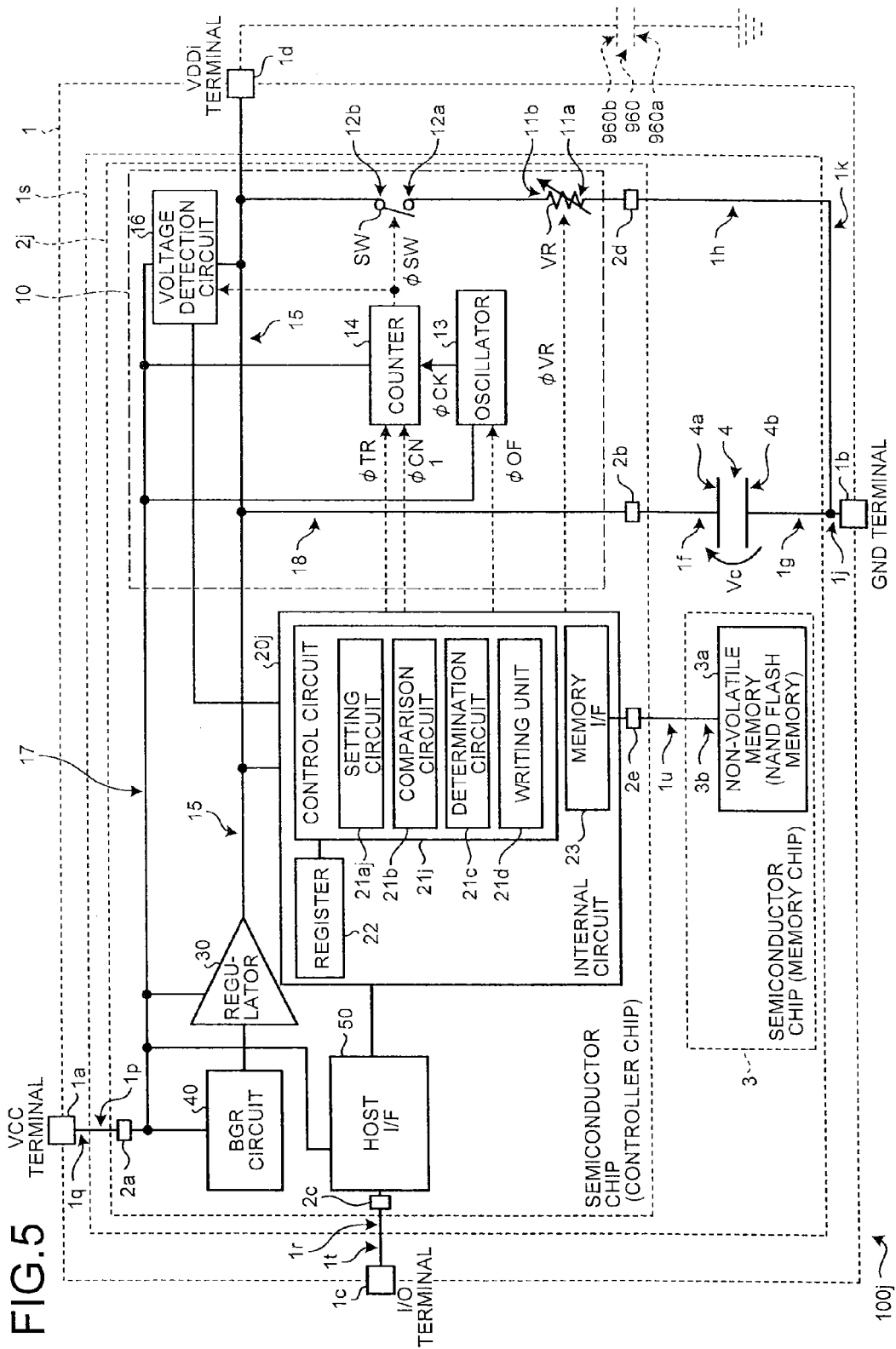
FIG. 5 is a schematic diagram of a configuration of a semiconductor device according to a second embodiment.

Specifically, the host 300 includes an internal clock 300a (see FIG. 1). The control circuit 21j (see FIG. 5) obtains information of a current time from the host 300 when determining the capacitance of capacitor 4 is OK or NG. The control circuit 21j stores into a register 22 a determination result associating with a time at which the control circuit 21j performs a determination.

Figure 10:
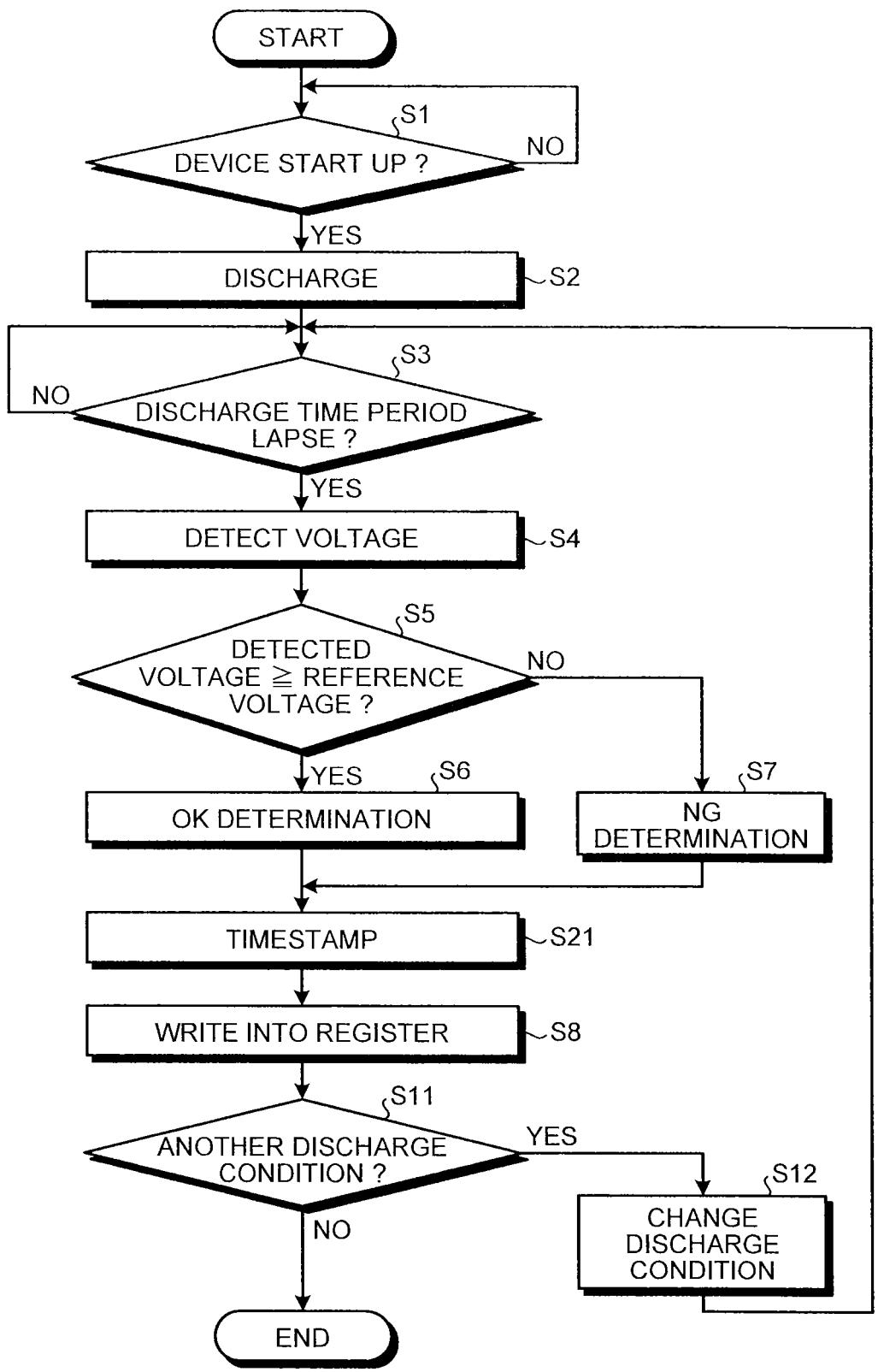
FIG. 10 is a flowchart of an operation of a semiconductor device according to a third embodiment.

For example, an operation of the semiconductor device 100j is different from the second embodiment in the following points as shown in FIG. 10.

In step S21, the control circuit 21j performs an operation regarding a timestamp. That is, the control circuit 21j inquires at the host 300 about the timestamp to acquire the timestamp from the host 300. The control circuit 21j generates history information by additionally correlating, with timestamps, the determination result information where the identifier of a discharge condition and the determination result are associated with each other.

With this operation, for example, in step S8 as shown in FIG. 10, the history information 221 as shown in FIG. 11 is written to the register 22. FIG. 11 is a schematic diagram of one example of a data structure of history information stored in the register 22.

For example, as shown in FIG. 11, the history information 221 may include a condition identifier column 221a, a determination result column 221b and a timestamp column 221c. Identifiers of the discharge conditions are stored into the condition identifier column 221a. Determination results by means of the control circuit 21j are stored into the determination result column 221b. Timestamps according to the current time information are stored into the timestamp column 221c.

For example, by referring to the history information 221, it is possible to recognize that a time when determination result being "OK" under a discharge condition CD1 is a time "tA1". It is also possible to recognize that a time when determination result being "OK" under a discharge condition CD2 is a time "tA2". It is also possible to recognize that a time when determination result being "NG" under a discharge condition CD1 is a time "tB1".

It is also possible to recognize that a time when determination result being "OK" under a discharge condition CD2 is a time "tB2". It is also possible to recognize that a time when determination result being "NG" under a discharge condition CD1 is a time "tC1". It is also possible to recognize that a time when determination result being "NG" under a discharge condition CD2 is a time "tC2".

That is, when capacitance of the capacitor 4 degrades with time serially to Ca->Cb->Cc, it is possible to recognize that a degree of aged deterioration of capacitance of the capacitor 4 is nearly at the level of Ca at a time tA1≈tA2 on which both a discharge condition CD1 and a discharge condition CD4 are OK. It is possible to recognize that a degree of aged deterioration of capacitance of the capacitor 4 is nearly at the level of Cb at a time tB1≈tB2 on which a discharge condition CD1 is NG and a discharge condition CD2 is OK. It is possible to recognize that a degree of aged deterioration of capacitance of the capacitor 4 is nearly at the level of Cc at a time tC1≈tC2 on which both a discharge condition CD1 and a discharge condition CD2 are NG. In this way, it is possible to recognize history in which capacitance of the capacitor 4 degrades with time serially to Ca->Cb->Cc.

As described above, in a third embodiment, in the semiconductor device 100j, the resister 22 stores a determination result by the control circuit 21j and a time when the determination is performed by the control circuit 21j with the determination result and the time associated with each other. With this configuration and operation, for example, the host 300 receiving the history information of the plurality of determination results transmitted from a side of the register 22 can recognize a degree of aged deterioration of capacitance of the capacitor 4 together with their associated times as a history by comparing the history information of the plurality of determination results.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a package;
a semiconductor chip which has an electrode and is implemented in the package; and
a capacitor which is implemented in the package, one terminal of the capacitor being electrically connected to the electrode of the semiconductor chip, another terminal of the capacitor being electrically connected to a ground terminal of the package,
the semiconductor chip including a capacitance measurement circuit which measures a level of capacitance of the capacitor via the electrode of the semiconductor chip,
the capacitor measurement circuit including:
a variable resistance; and
a switch which makes a loop circuit including the capacitor and the variable resistance closed when discharging charges stored in the capacitor, and which makes the loop circuit including the capacitor and the variable resistance open when recharging charges in the capacitor.

2. The semiconductor device set forth in claim 1, wherein the capacitor measurement circuit further includes:
an oscillator; and
a counter which counts a number of clocks output from the oscillator to cause the switch to turn on or off in accordance with a result of counting.

3. The semiconductor device set forth in claim 2, wherein the counter causes the switch to turn off at a timing when the counter counts a number of clocks to be counted.

4. The semiconductor device set forth in claim 3, wherein the semiconductor chip includes a control circuit which controls at least one of a discharging current and a discharging time period of the capacitor, and
the control circuit controls at least one of a resistance value of the variable resistance, a frequency of clock output from the oscillator and the number of clocks to be counted by the counter.

5. The semiconductor device set forth in claim 1, wherein the capacitor measurement circuit further includes a voltage detecting circuit which detects a voltage of a power source line electrically connecting the electrode of the semiconductor chip with the switch.

6. The semiconductor device set forth in claim 5, wherein the voltage detecting circuit detects a voltage of the capacitor, and
the control circuit compares the detected voltage with a reference voltage to determine whether a level of capacitance of the capacitor is OK or NG in accordance with a result of the comparison.

* * * * *